US011557679B2

(12) United States Patent
Kikuchi et al.

(10) Patent No.: US 11,557,679 B2
(45) Date of Patent: Jan. 17, 2023

(54) ACTIVE MATRIX SUBSTRATE AND DISPLAY DEVICE

(71) Applicant: Sharp Kabushiki Kaisha, Sakai (JP)

(72) Inventors: Tetsuo Kikuchi, Sakai (JP); Tohru Daitoh, Sakai (JP); Masahiko Suzuki, Sakai (JP); Setsuji Nishimiya, Sakai (JP); Kengo Hara, Sakai (JP); Hitoshi Takahata, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 101 days.

(21) Appl. No.: 17/183,411

(22) Filed: Feb. 24, 2021

(65) Prior Publication Data

US 2021/0273107 A1 Sep. 2, 2021

Related U.S. Application Data

(60) Provisional application No. 62/983,792, filed on Mar. 2, 2020.

(51) Int. Cl.
*H01L 27/12* (2006.01)
*H01L 29/24* (2006.01)
(Continued)

(52) U.S. Cl.
CPC ........ *H01L 29/7869* (2013.01); *G02F 1/1368* (2013.01); *H01L 27/1225* (2013.01);
(Continued)

(58) Field of Classification Search
CPC .............. H01L 27/1225; H01L 27/323; H01L 27/3262; H01L 29/7869; H01L 29/24;
(Continued)

(56) References Cited

U.S. PATENT DOCUMENTS 10,680,117 B2 * 6/2020 Ji ...................... H01L 29/7869
2008/0024416 A1 1/2008 Onogi et al.
(Continued)

FOREIGN PATENT DOCUMENTS

JP 2007-073562 A 3/2007
JP 2008-032899 A 2/2008
(Continued)

*Primary Examiner* — Nikolay K Yushin
(74) *Attorney, Agent, or Firm* — Keating & Bennett, LLP

(57) ABSTRACT

An active matrix substrate has pixel regions, and includes a substrate, pixel TFTs disposed to respectively correspond to the pixel regions, and pixel electrodes electrically connected to the pixel TFTs. The pixel TFTs are each a top gate structure TFT that has an oxide semiconductor layer, a gate insulating layer on the oxide semiconductor layer, and a gate electrode opposing the oxide semiconductor layer with the gate insulating layer therebetween. The gate insulating layer is formed of silicon oxide and includes a lower layer contacting the oxide semiconductor layer, and an upper layer on the lower layer. The lower layer H/N ratio of hydrogen atoms to nitrogen atoms in the lower layer is 1.5 to 5.0. The upper layer H/N ratio of hydrogen atoms to nitrogen atoms in the upper layer is 0.9 to 2.0. The lower layer H/N ratio is larger than the upper layer H/N ratio.

8 Claims, 10 Drawing Sheets

(51) Int. Cl.
*H01L 29/786* (2006.01)
*G02F 1/1368* (2006.01)
*H01L 29/49* (2006.01)
*H01L 27/32* (2006.01)

(52) U.S. Cl.
CPC .......... *H01L 29/24* (2013.01); *H01L 29/4908* (2013.01); *H01L 29/78696* (2013.01); *H01L 27/323* (2013.01); *H01L 27/3262* (2013.01)

(58) Field of Classification Search
CPC ........... H01L 29/4908; H01L 29/78696; H01L 29/78633; G02F 1/1368; G02F 1/134363; G02F 1/13338; G02F 1/136222
See application file for complete search history.

(56) References Cited

U.S. PATENT DOCUMENTS

| | | |
|---|---|---|
| 2008/0035920 A1 | 2/2008 | Takechi et al. |
| 2009/0323005 A1 | 12/2009 | Ota |
| 2011/0284959 A1 | 11/2011 | Kimura et al. |
| 2012/0138922 A1 | 6/2012 | Yamazaki et al. |
| 2012/0241733 A1 | 9/2012 | Morooka et al. |
| 2013/0320334 A1 | 12/2013 | Yamazaki et al. |
| 2014/0286076 A1 | 9/2014 | Aoki et al. |
| 2016/0187690 A1 | 6/2016 | Nam et al. |
| 2018/0004322 A1 | 1/2018 | Nakanishi |
| 2019/0165184 A1* | 5/2019 | Ji ..................... H01L 29/78633 |
| 2019/0339557 A1 | 11/2019 | Tominaga et al. |

FOREIGN PATENT DOCUMENTS

| | | |
|---|---|---|
| JP | 2008-040343 A | 2/2008 |
| JP | 2010-008758 A | 1/2010 |
| JP | 2012-134475 A | 7/2012 |
| JP | 2012-204077 A | 10/2012 |
| JP | 2014-007399 A | 1/2014 |
| JP | 5613745 B2 | 10/2014 |
| JP | 2014-209727 A | 11/2014 |
| JP | 2016-126336 A | 7/2016 |
| JP | 2018-005484 A | 1/2018 |
| WO | 2017/126603 A1 | 7/2017 |
| WO | 2018/092758 A1 | 5/2018 |

* cited by examiner

ACTIVE MATRIX SUBSTRATE AND DISPLAY DEVICE

BACKGROUND

1. Field

The present disclosure relates to an active matrix substrate and a display device.

2. Description of the Related Art

Currently, display devices equipped with active matrix substrates in which a switching element is provided for each pixel are prevalent. An active matrix substrate equipped with a thin film transistor (hereinafter may also be referred to as a "TFT") serving as a switching element is called a TFT substrate. In this description, a region of the TFT substrate that corresponds to a pixel of the display device is referred to as a pixel region. A TFT disposed in a pixel region of the active matrix substrate to serve as a switching element may be referred to as a "pixel TFT".

In recent years, there have been proposals of using an oxide semiconductor as a material for an active layer of a TFT instead of amorphous silicon or polycrystalline silicon. A TFT that has an oxide semiconductor film as an active layer is referred to as an "oxide semiconductor TFT". Japanese Unexamined Patent Application Publication No. 2012-134475 discloses an active matrix substrate that uses an In—Ga—Zn—O-based semiconductor film as an active layer of a TFT.

An oxide semiconductor has higher mobility than amorphous silicon. Thus, an oxide semiconductor TFT can operate at higher speed than an amorphous silicon TFT. Moreover, since an oxide semiconductor film is formed through a process easier than that for a polycrystalline silicon film, application to a device that requires a large area is also possible.

The structure of a TFT is roughly categorized into a bottom gate structure and a top gate structure. Currently, the bottom gate structure is often employed for the oxide semiconductor TFTs; however, use of the top gate structure has also been proposed (for example, Japanese Unexamined Patent Application Publication No. 2012-204077). Since the top gate structure can decrease the thickness of the gate insulating layer, high current supplying performance is obtained.

In an active matrix substrate or a display device equipped with a top gate structure oxide semiconductor TFT, decreasing the variation in TFT characteristics and decreasing the shift amount ($\Delta Vth$) of a threshold voltage are desired to improve reliability.

Japanese Patent No. 5613745 proposes a structure for improving the reliability of a top gate structure oxide semiconductor TFT. According to the structure proposed in Japanese Patent No. 5613745, a gate insulating layer placed between an oxide semiconductor layer and a gate electrode includes a first gate insulating film in contact with the oxide semiconductor layer and a second gate insulating film disposed on the first gate insulating film. The first gate insulating film is a fluorine-containing silicon oxide film. The second gate insulating film is a silicon oxide film having a higher hydrogen concentration than the first gate insulating film. It is described that, in this structure, the first gate insulating film is dense and has a relatively low hydrogen concentration, and thus the variation in TFT characteristics is decreased. In addition, it is described that since the second gate insulating film does not contain fluorine, roughening of source and drain electrode surfaces during formation of the second gate insulating film can be prevented.

However, according to the studies conducted by the inventors of the present application, it has been found that employing the structure disclosed in Japanese Patent No. 5613745 cannot sufficiently decrease the variation in TFT characteristics and cannot sufficiently improve the reliability.

The present disclosure has been made in view of the aforementioned issues to improve the reliability of an active matrix substrate and a display device equipped with a top gate structure oxide semiconductor TFT.

SUMMARY

According to an aspect of the present disclosure, there is provided an active matrix substrate that has a plurality of pixel regions arranged in a matrix, the active matrix substrate including: a substrate; pixel TFTs supported by the substrate and disposed to respectively correspond to the plurality of pixel regions; and pixel electrodes respectively disposed in the plurality of pixel regions and electrically connected to the pixel TFTs. Each of the pixel TFTs is a top gate structure TFT that has an oxide semiconductor layer, a gate insulating layer disposed on the oxide semiconductor layer, and a gate electrode disposed to oppose the oxide semiconductor layer with the gate insulating layer therebetween. The gate insulating layer is formed of silicon oxide. The gate insulating layer includes a lower layer in contact with the oxide semiconductor layer and an upper layer placed on the lower layer. When a ratio of the number of hydrogen atoms to the number of nitrogen atoms contained in the lower layer is referred to as a lower layer H/N ratio and a ratio of the number of hydrogen atoms to the number of nitrogen atoms contained in the upper layer is referred to as an upper layer H/N ratio, the lower layer H/N ratio is 1.5 or more and 5.0 or less, the upper layer H/N ratio is 0.9 or more and 2.0 or less, and the lower layer H/N ratio is larger than the upper layer H/N ratio.

According to another aspect of the disclosure, there is provided a display device including the active matrix substrate described above.

DESCRIPTION OF THE EMBODIMENTS

Figure 1A:
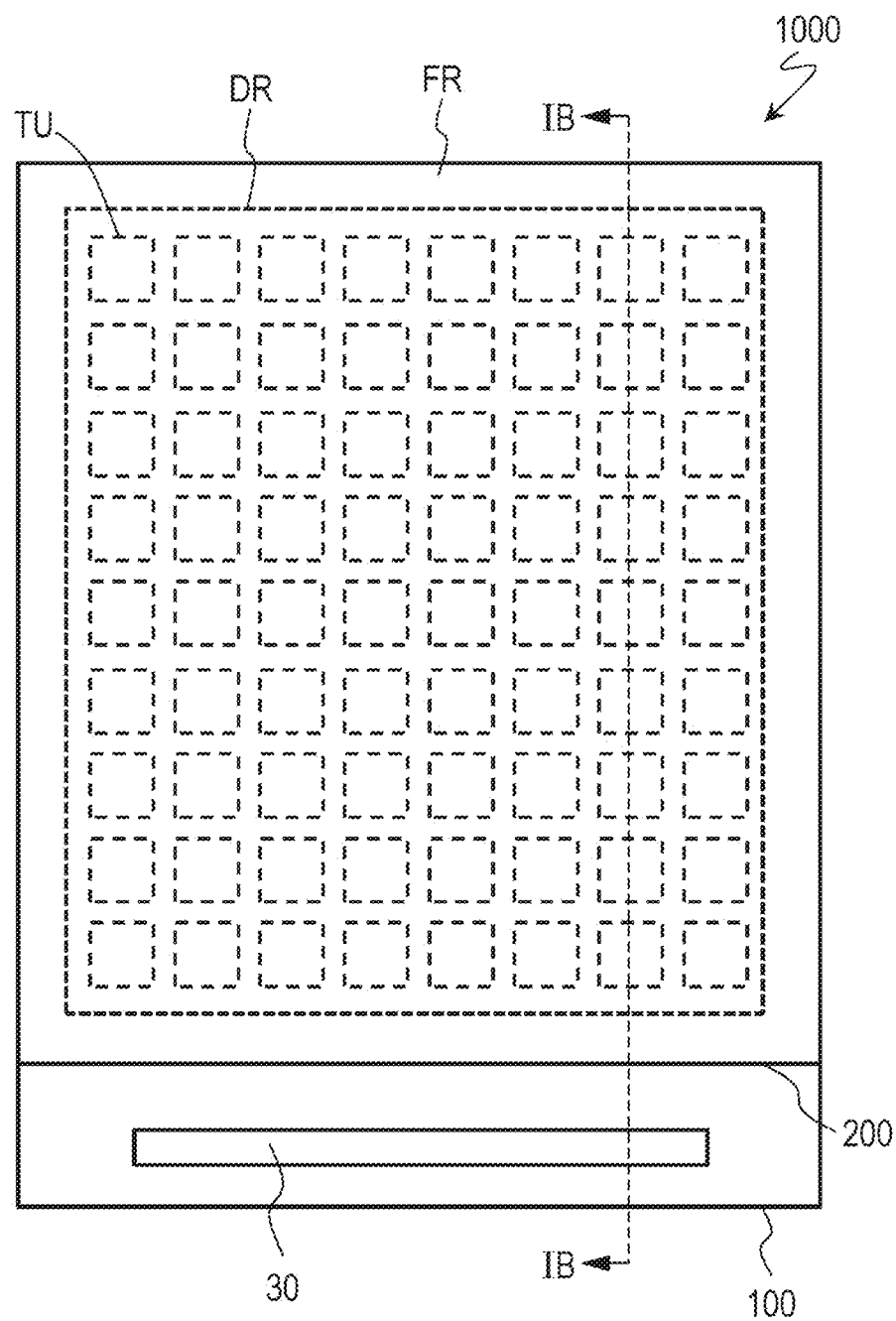
FIG. 1A is a plan view schematically showing a liquid crystal display device 1000 according to an embodiment of the present disclosure.

Embodiments of the present disclosure will now be described with reference to the drawings. Note that the present disclosure is not limited by the following embodiments. In the drawings referred in the description below, constituent elements that have substantially the same functions are denoted by common reference signs, and description thereof may be omitted. In addition, for the convenience of description, in the drawings referred in the description below, structures may be simplified or schematically illustrated, or some of the constituent elements are omitted. The dimensional ratios among the constituent elements illustrated in the respective drawings do not necessarily represent actual dimensional ratios.

The active matrix substrate according to an embodiment of the present disclosure is used in, for example, an in-cell touch panel-type liquid crystal display device that uses a horizontal electric field-mode liquid crystal display panel. Hereinafter, an in-cell touch panel-type liquid crystal display device that uses a liquid crystal display panel of a fringe field switching (FFS) mode, which is one of the horizontal electric field modes, is described as an example.

Overall Structure of in-Cell Touch Panel-Type Liquid Crystal Display Device

Figure 1B:
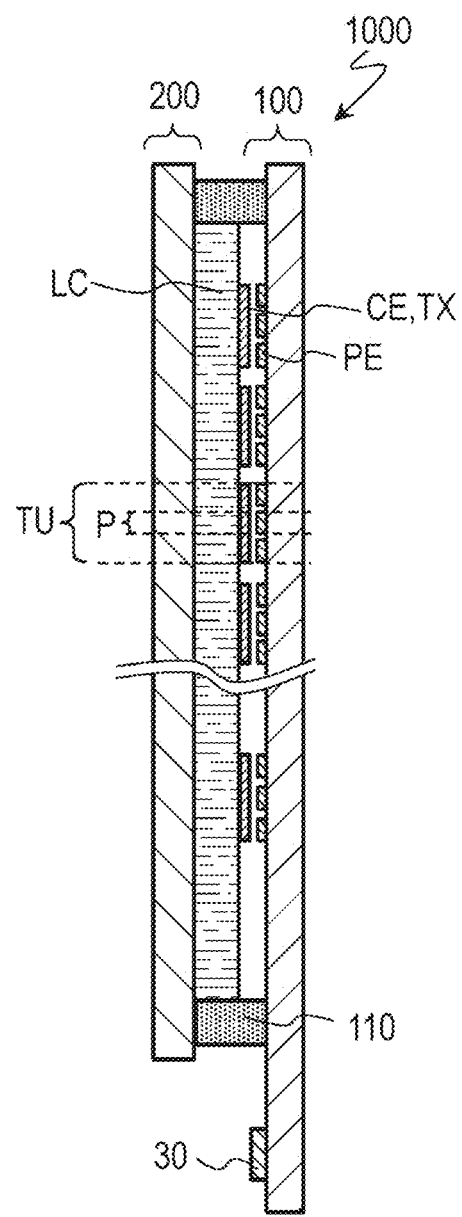
FIG. 1B is a cross-sectional view schematically showing the liquid crystal display device 1000, and illustrates a cross section taken along line IB-IB in FIG. 1A.

Referring to FIGS. 1A and 1B, an in-cell touch pane-type liquid crystal display device (hereinafter simply referred to as a "liquid crystal display device") 1000 of this embodiment is described. FIG. 1A is a plan view schematically showing the liquid crystal display device 1000. FIG. 1B is a cross-sectional view taken along line IB-IB in FIG. 1A. The liquid crystal display device 1000 has, for example, a self capacitance-type touch sensor.

The liquid crystal display device 1000 has a display region DR and a peripheral region (also referred to as a "frame region") FR around the display region DR. The display region DR includes pixels P arranged in a matrix that includes multiple rows and multiple columns, multiple gate wires (not illustrated) extending in a row direction, and multiple source wires (not illustrated) extending in a column direction.

The display region DR further includes multiple touch detection units TU arranged in a matrix. In the example shown in FIG. 1B, each touch detection unit TU is arranged to correspond to two or more pixels P.

Meanwhile, peripheral circuits including drive circuits, terminal units, etc., are disposed in the peripheral region FR. Although not shown in the drawings, the drive circuits include gate drivers that supply scan signals to the pixel TFTs through gate wires, source drivers that supply display signals to the pixel TFTs through source wires, drive circuits (referred to as "touch-drive units"), for driving the touch sensor, etc. These drive circuits are disposed (either mounted or integrally formed) on, for example, the active matrix substrate 100. Here, a semiconductor chip 30 that includes some of the drive circuits, such as the touch drive units and source drivers, is mounted in the active matrix substrate 100, and, although not shown in the drawings, gate drivers are integrally (monolithically) formed in the active matrix substrate 100.

The liquid crystal display device 1000 is equipped with the active matrix substrate 100, a counter substrate 200 arranged to oppose the active matrix substrate 100, and a liquid crystal layer LC disposed between the active matrix substrate 100 and the counter substrate 200. Typically, the liquid crystal display device 1000 is further equipped with a backlight (lighting device) disposed on a rear side (side opposite to an observer) of the active matrix substrate 100. The liquid crystal layer LC between the active matrix substrate 100 and the counter substrate 200 is sealed with a sealing material 110.

The active matrix substrate (may also be referred to as a "TFT substrate") 100 has, as a pair of electrodes for applying a voltage to the liquid crystal layer LC, multiple pixel electrodes PE and a common electrode CE. Although not shown in the drawings, an alignment film (horizontal alignment film) is disposed on the outermost surface of the active matrix substrate 100 so as to be in contact with the liquid crystal layer LC.

The counter substrate 200 has a color filter and a black matrix (neither of them is shown in the drawings). A horizontal alignment film (not illustrated) is also disposed on the outermost surface of the counter substrate 200 so as to be in contact with the liquid crystal layer LC.

Although not shown in the drawings, the liquid crystal display device 1000 has a pair of polarizer plates that oppose each other with at least the liquid crystal layer LC therebetween. For example, one of the pair of the polarizer plates is disposed on the rear side of the active matrix substrate 100, and the other is disposed on the front side of the counter substrate 200.

A touch sensor is built in the liquid crystal display device 1000. The touch sensor includes electrodes TX for the touch sensor (hereinafter, "touch sensor electrodes") and wires for the touch sensor not shown in the drawings (hereinafter referred to as "touch wires"). The touch sensor electrodes TX and the touch wires are disposed on the active matrix substrate 100.

One touch sensor electrode TX is provided for each of the touch detection units TU. In this example, the common electrode CE is divided into multiple segments, and each of the segments also functions as a touch sensor electrode TX. Each of the touch sensor electrodes TX is connected, via a corresponding touch wire, to a touch drive unit disposed in the semiconductor chip 30.

Figure 1C:
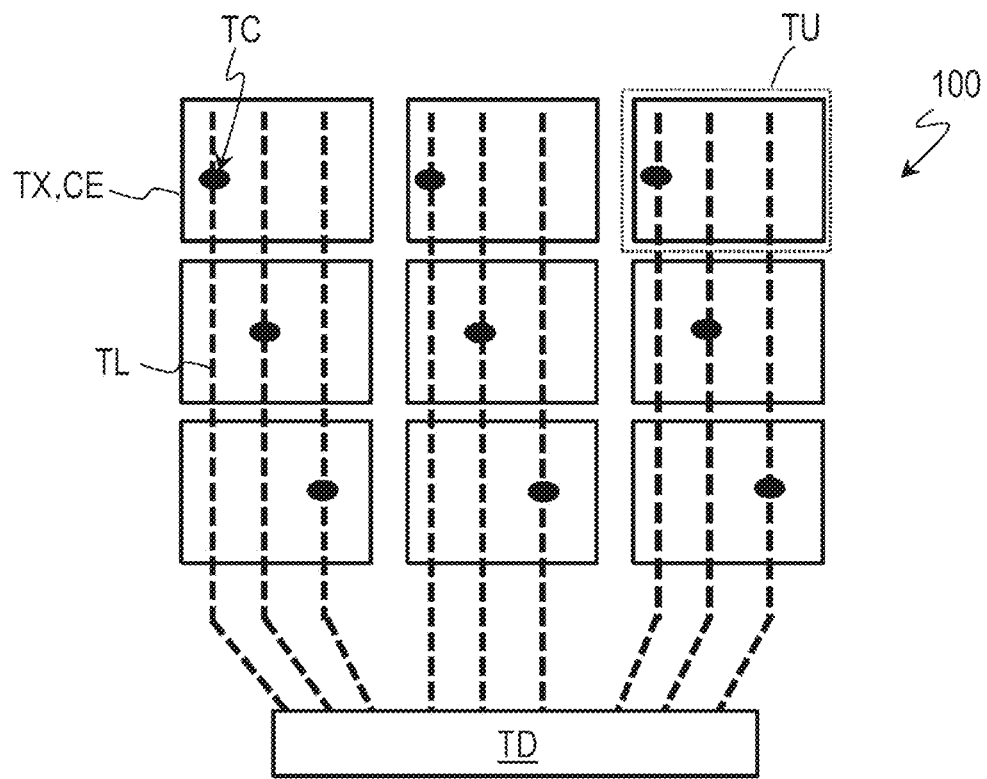
FIG. 1C is a plan view showing an example of the positional relationship between touch sensor electrodes TX and touch wires TL in an active matrix substrate 100 in the liquid crystal display device 1000.

FIG. 1C is a plan view showing an example of the positional relationship between touch sensor electrodes TX and touch wires TL on the active matrix substrate 100. For the sake of simplicity, FIG. 1C shows an example case in which the touch detection units TU are arranged in three columns and three rows. The touch detection units TU are respectively arranged to correspond to the multiple pixels (not illustrated).

The active matrix substrate 100 has multiple touch sensor electrodes TX provided for the respective touch detection units TU, and the touch wires TL extending in the column direction.

Each of the touch sensor electrodes TX is electrically connected to a corresponding touch wire TL. A connecting portion TC between the touch sensor electrode TX and the touch wire TL is referred to as a "touch wire contact portion". It is sufficient if at least one touch wire TL is provided for one touch sensor electrode TX. Two or more touch wire contact portions TC may be provided for one touch sensor electrode TX.

The touch wires TL are connected to a touch drive unit TD disposed in the peripheral region FR. As previously described, the touch sensor electrodes TX also function as the common electrode CE. The touch drive unit TD is configured to switch between a display mode in which the touch sensor electrodes TX function as the common electrode CE and a touch detection mode in which the touch sensor electrodes TX function as the touch sensor electrodes TX in a time sharing manner. For example, the touch drive unit TD applies a common signal to the touch sensor electrodes TX (common electrode CE) via the touch wires TL in the display mode. Meanwhile, in the touch detection mode, the touch drive unit TD applies a touch drive signal to the touch sensor electrodes TX via the touch wires TL.

Here, an example in which the liquid crystal display device 1000 is equipped with a self capacitance-type touch sensor is described; alternatively, a mutual capacitance-type touch sensor may be provided. In this case, other electrodes for the touch sensor may be disposed on the counter substrate 200. For example, the touch sensor electrodes TX may extend in one direction (for example, in the row direction), the electrodes for the touch sensor disposed on the counter substrate may extend in another direction (for example, in the column direction), and the change in capacitance at a portion (touch detection unit) where these electrodes intersect may be detected. Specific structures, drive methods, etc., of the mutual capacitance-type and self capacitance-type touch sensors are described in, for example, Japanese Unexamined Patent Application Publication No. 2018-5484, International Application No. 2018/092758, International Application No. 2017/126603, Japanese Unexamined Patent Application Publication No. 2016-126336, etc., and are publicly known; thus, detailed descriptions thereof are omitted. For reference, the entire contents of the disclosures in Japanese Unexamined Patent Application Publication No. 2018-5484, International Application No. 2018/092758, International Application No. 2017/126603, and Japanese Unexamined Patent Application Publication No. 2016-126336 are incorporated in this description.

In this description, irrespective of whether the touch sensor formed on the active matrix substrate 100 is of a self capacitance type or a mutual capacitance type, the electrodes for the touch sensor disposed on the active matrix substrate 100 side are simply referred to as the "touch sensor electrodes TX", and the wires for the touch sensor electrically connected to the touch sensor electrodes TX are referred to as the "touch wires".

Structure of Active Matrix Substrate 100

Figure 2:
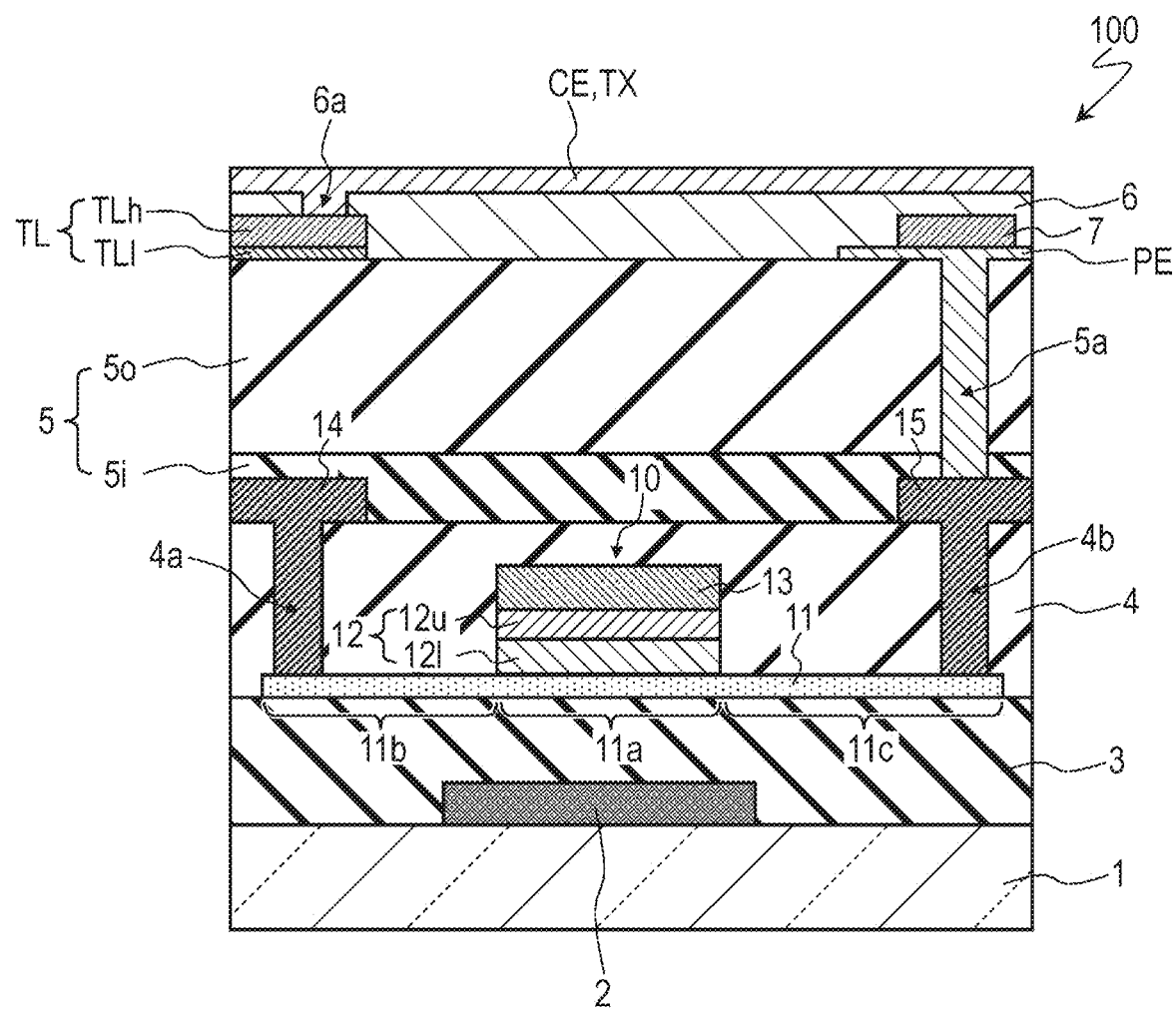
FIG. 2 is a cross-sectional view schematically showing a pixel structure of the active matrix substrate 100.

Next, the structure of the active matrix substrate 100 is described. The active matrix substrate 100 has multiple pixel regions arranged in a matrix. The "pixel regions" are the regions that correspond to the pixels in the liquid crystal display device 1000. The pixel regions may simply be referred to as "pixels". FIG. 2 is a cross-sectional view schematically showing a pixel structure of the active matrix substrate 100.

As shown in FIG. 2, the active matrix substrate 100 is equipped with a substrate 1, a pixel TFT 10, a pixel electrode PE, a common electrode CE, and a light-blocking layer 2. As has been described, the active matrix substrate 100 is further equipped with multiple gate wires, multiple source wires, and multiple touch wires TL.

The substrate 1 is transparent and is insulating. The substrate 1 is, for example, a glass substrate or a plastic substrate.

The pixel TFT 10 is supported by the substrate 1. One pixel TFT 10 is provided for the corresponding one of the multiple pixel regions. The pixel TFT 10 is a top gate structure TFT.

The light-blocking layer 2 is disposed under the pixel TFT 10. In other words, the light-blocking layer 2 is placed between the pixel TFT 10 and the substrate 1. The light-blocking layer 2 is formed of a light-blocking material (for example, a metal material).

A lower insulating layer 3 is disposed to cover the light-blocking layer 2. For example, a silicon oxide ($SiO_2$) layer or a silicon nitride ($SiN_x$) layer can be used as the lower insulating layer 3. The lower insulating layer 3 may have a multilayer structure, and, for example, may include a silicon nitride layer as a lower layer and a silicon oxide layer as an upper layer.

The pixel TFT 10 has an oxide semiconductor layer 11 disposed on the lower insulating layer 3, a gate insulating layer 12 disposed on the oxide semiconductor layer 11, and a gate electrode 13 disposed to oppose the oxide semiconductor layer 11 with the gate insulating layer 12 therebetween. The pixel TFT 10 further has a source electrode 14 and a drain electrode 15 that are electrically connected to the oxide semiconductor layer 11.

The gate electrode 13 is electrically connected to the corresponding gate wire, and a scan signal is supplied through the gate wire. The gate electrode 13 may be integrally formed with the gate wire. The source electrode 14 is electrically connected to the corresponding source wire, and a display signal is supplied through the source wire. The source electrode 14 may be integrally formed with the source wire. The drain electrode 15 is electrically connected to the pixel electrode PE.

When viewed in a direction of a line normal to the substrate surface, the gate insulating layer 12 is formed on the oxide semiconductor layer 11 so as to overlap a portion of the oxide semiconductor layer 11.

The oxide semiconductor layer 11 includes a channel region 11a, and a first low-resistance region 11b and a second low-resistance region 11c that are placed on two sides of the channel region 11a. When viewed in a direction of a line normal to the substrate surface, the channel region 11a overlaps the gate insulating layer 12 (and the gate electrode 13). When viewed in a direction of a line normal to the substrate surface, the first low-resistance region 11b and the second low-resistance region 11c do not overlap the gate insulating layer 12 (and the gate electrode 13), and have a smaller specific resistance than the channel region 11a. The first low-resistance region 11b is placed on the source electrode 14 side of the channel region 11a. The second low-resistance region 11c is placed on the drain electrode 15 side of the channel region 11a. The first low-resistance region 11b and the second low-resistance region 11c can be formed by, for example, performing a resistance-decreasing process on the oxide semiconductor layer 11 by using the gate electrode 13 and the gate insulating layer 12 as a mask. The light-blocking layer 2 disposed to correspond to each pixel TFT 10 overlaps at least the channel region 11a when viewed in a direction of a line normal to the substrate surface.

An upper insulating layer 4 is disposed on the oxide semiconductor layer 11, the gate insulating layer 12, and the gate electrode 13. The source electrode 14 is disposed on the upper insulating layer 4 and in an opening portion (source-side opening portion) 4a formed in the upper insulating layer 4, and is connected to a portion (a portion of the first low-resistance region 11b) of the oxide semiconductor layer 11 in the source-side opening portion 4a. Similarly, the drain electrode 15 is disposed on the upper insulating layer 4 and in an opening portion (drain-side opening portion) 4b formed in the upper insulating layer 4, and is connected to another portion (a portion of the second low-resistance region 11c) of the oxide semiconductor layer 11 in the drain-side opening portion 4b.

The pixel TFT 10 is covered with an interlayer insulating layer 5. In this example, the interlayer insulating layer 5 has a multilayer structure that includes an inorganic insulating layer (passivation layer) 5i and an organic insulating layer (planarizing layer) 5o disposed on the inorganic insulating layer 5i. The insulating layers that are described as specific examples of the lower insulating layer 3 can be used as the inorganic insulating layer 5i, and, for example, a silicon nitride layer can be used. For example, a photosensitive resin material can be used as the material for the organic insulating layer 5o.

The pixel electrode PE is disposed on the interlayer insulating layer 5. The pixel electrode PE is formed of a transparent conductive material (for example, ITO or IZO). The pixel electrode PE is provided to each of the multiple pixel regions, and is electrically connected to the pixel TFT 10. More specifically, the pixel electrode PE is electrically connected to the drain electrode 15 of the pixel TFT 10. Here, the pixel electrode PE is connected to the drain electrode 15 in a pixel contact hole 5a formed in the interlayer insulating layer 5.

A dielectric layer 6 is disposed to cover the pixel electrode PE. The insulating layers that are described as specific examples of the lower insulating layer 3 can be used as the dielectric layer 6, and, for example, a silicon nitride layer can be used.

The common electrode CE is disposed on the dielectric layer 6. The common electrode CE is formed of a transparent conductive material (for example, ITO or IZO). In the common electrode CE, at least one slit is formed for each pixel region. The common electrode CE is divided into multiple segments for respective touch detection units TU. Each of the segments functions as a touch sensor electrode TX.

Each of the touch sensor electrodes TX is electrically connected to a corresponding touch wire TL. The touch wire TL is formed on the interlayer insulating layer 5. Specifically, each of the touch sensor electrodes TX is connected to the touch wire TL in a contact hole 6a formed in the dielectric layer 6. In the example shown in the drawings, the touch wire TL has a multilayer structure that includes a lower layer wire layer TL1 and an upper layer wire layer TLh disposed on the lower layer wire layer TL1. The lower layer wire layer TL1 is formed of the same transparent conductive film as the pixel electrode PE. The upper layer wire layer TLh is formed of a metal material. In the example shown in the drawings, a protective electrode layer 7 is disposed on the pixel electrode PE so as to overlap the pixel contact hole 5a. The protective electrode layer 7 is formed of the same metal film as the upper layer wire layer TLh of the touch wire TL.

In the active matrix substrate 100 of this embodiment, the gate insulating layer 12 is formed of silicon oxide ($SiO_2$). Since the gate insulating layer 12 is formed of silicon oxide, oxygen deficiencies occurring in the channel region 11a of the oxide semiconductor layer 11 can be decreased.

The gate insulating layer 12 has a multilayer structure. Specifically, the gate insulating layer 12 includes a lower layer 121 in contact with the oxide semiconductor layer 11 and an upper layer 12u placed on the lower layer 121.

Here, the ratio of the number of hydrogen atoms to the number of nitrogen atoms contained in the lower layer 121 is referred to as a "lower layer H/N ratio", and the ratio of the number of hydrogen atoms to the number of nitrogen atoms contained in the upper layer 12u is referred to as an "upper layer H/N ratio". The lower layer H/N ratio is 1.5 or more and 5.0 or less. Meanwhile, the upper layer H/N ratio is 0.9 or more and 2.0 or less. In addition, the lower layer H/N ratio is larger than the upper layer H/N ratio.

In the active matrix substrate 100 of this embodiment, since the gate insulating layer 12 has such a structure, reliability can be improved. This point is described below.

The inventors of the present disclosure have conducted detailed investigations on the influence of the structure of the gate insulating layer on the characteristics and reliability of the top gate structure TFT. In doing so, the ratio of the number of hydrogen atoms to the number of nitrogen atoms (H/N ratio) contained in the gate insulating layer is focused, and it has been found that the aforementioned effects are obtained when the gate insulating layer has a multilayer structure in which different H/N ratios are present.

Specifically, the lower layer H/N ratio may be 1.5 or more. When the lower layer H/N ratio is less than 1.5, the TFT characteristics may assume a conduction mode (the TFT may be conducting at all times). However, at a large lower layer H/N ratio, the shift amount ($\Delta Vth$) of the threshold voltage increases and the reliability is degraded; thus, the lower layer H/N ratio may be not excessively large. From the viewpoint of decreasing the $\Delta Vth$, the lower layer H/N ratio may be, specifically, 5.0 or less. As such, the lower layer H/N ratio may be 1.5 or more and 5.0 or less.

Specifically, the upper layer H/N ratio may be 0.9 or more. When the upper layer H/N ratio is less than 0.9, the TFT characteristics may assume a conduction mode. However, at an excessively large upper layer H/N ratio, the $\Delta Vth$ increases and the reliability is degraded; thus, the upper layer H/N ratio may be not excessively large. From the viewpoint of decreasing the $\Delta Vth$, the upper layer H/N ratio may be, specifically, 2.0 or less. As such, the upper layer H/N ratio may be 0.9 or more and 2.0 or less.

Next, the results of reliability evaluation conducted by changing the lower layer H/N ratio and the upper layer H/N ratio are described. For the reliability evaluation, a positive bias temperature (PBT) stress test was used. The PBT stress test is a type of an accelerated test, and the changes in TFT characteristics that occur due to long-term use can be evaluated in a short time. In particular, the shift amount ($\Delta Vth$) of the threshold voltage of the TFT before and after the PBT stress test is an important indicator for investigating the reliability. The smaller the $\Delta Vth$, the higher the reliability. Here, the PBT stress test was conducted at a gate voltage of +30 V, a drain voltage and a source voltage of 0 V, a stress temperature of 60° C., and a stress application time of 1 hour.

Figure 3:
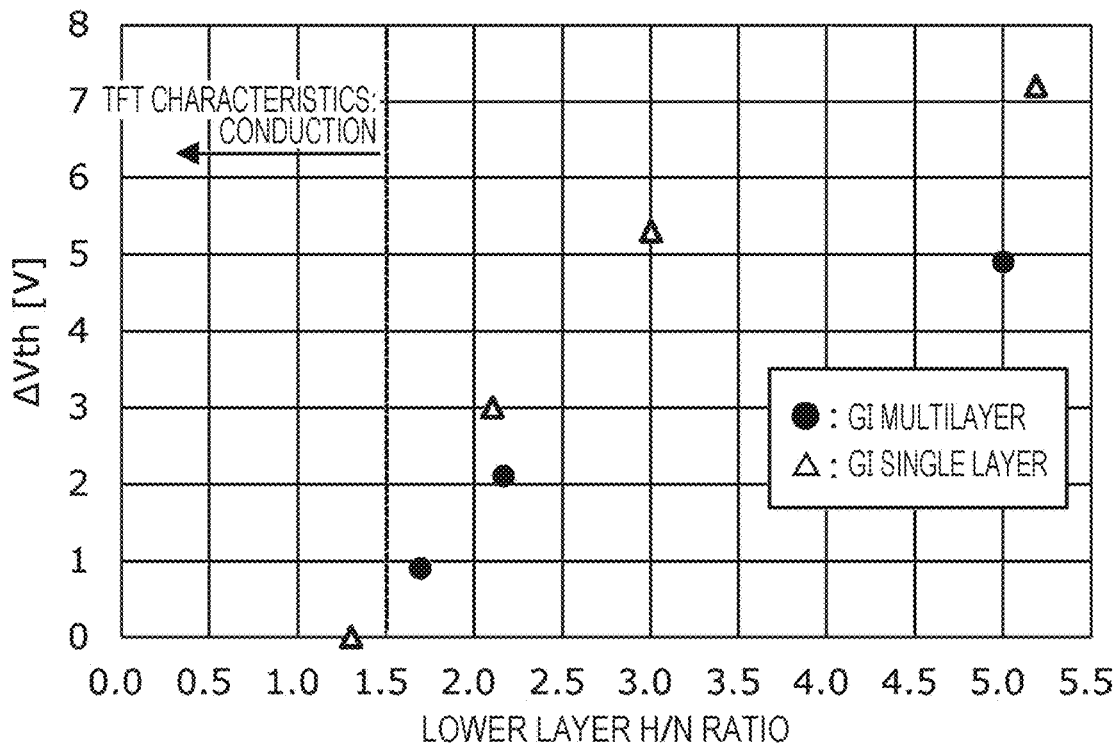
FIG. 3 is a graph showing the relationship between the lower layer H/N ratio and $\Delta Vth$.
Figure 4:
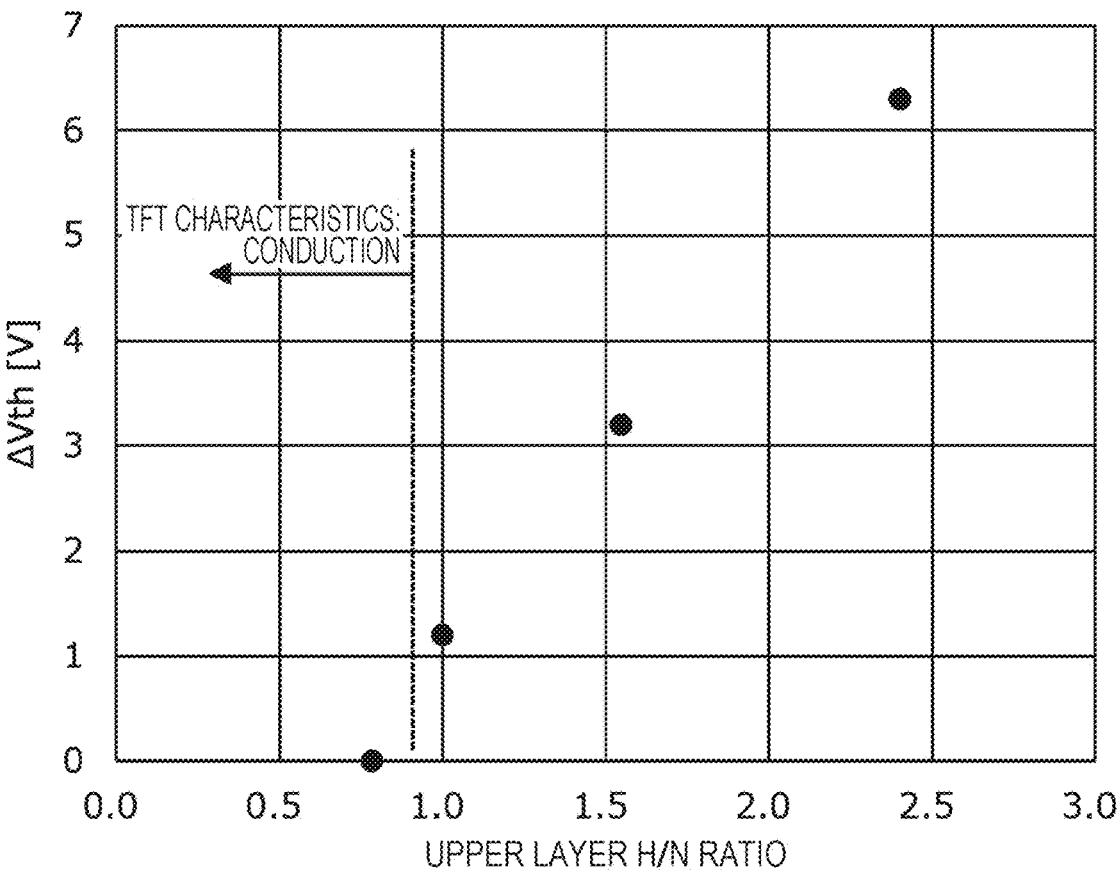
FIG. 4 is a graph showing the relationship between the upper layer H/N ratio and $\Delta Vth$.

FIG. 3 shows the results of the reliability evaluation conducted by changing the lower layer H/N ratio, and FIG. 4 shows the results of the reliability test conducted by changing the upper layer H/N ratio. FIG. 3 is a graph in which the horizontal axis indicates the lower layer H/N ratio and the vertical axis indicates the ΔVth, and FIG. 4 is a graph in which the horizontal axis indicates the upper layer H/N ratio and the vertical axis indicates the ΔVth. In the example shown in FIG. 3, the upper layer H/N ratio is constant (about 1.3), and in the example shown in FIG. 4, the lower layer H/N ratio is constant (about 1.6). Furthermore, FIG. 3 also shows the case in which the gate insulating layer is a single layer (indicated as "GI single layer" in the graph) for the comparison to the gate insulating layer having a multilayer structure (indicated as "GI multilayer" in the graph).

FIG. 3 shows that the ΔVth can be sufficiently decreased (for example, about 5 V or less) by setting the lower layer H/N ratio to 5.0 or less. In addition, FIG. 4 shows that the ΔVth can be sufficiently decreased (for example, about 5 V or less) by setting the upper layer H/N ratio to 2.0 or less.

As mentioned above, according to the embodiment of the present disclosure, since the ΔVth can be sufficiently decreased while preventing conduction of the pixel TFT 10, the reliability of the active matrix substrate 100 (and the liquid crystal display device 1000) can be improved.

From the viewpoint of decreasing the ΔVth, the lower layer H/N ratio may be 2.5 or less. Thus, it is considered that the lower layer H/N ratio may be 1.5 or more and 2.5 or less.

Similarly, from the viewpoint of decreasing the ΔVth, the upper layer H/N ratio may be 1.3 or less. Thus, it is considered that the upper layer H/N ratio may be 0.9 or more and 1.3 or less.

In addition, the ratio of the number of nitrogen atoms to the number of oxygen atoms is typically 0.1 or less in each of the lower layer 12*l* and the upper layer 12*u* of the gate insulating layer 12.

Method for Producing Active Matrix Substrate 100

Referring to FIGS. 5A to 8B, one example of a method for producing the active matrix substrate 100 is described. FIGS. 5A to 8B are process cross-sectional views showing the active matrix substrate 100 production process.

Figure 5A:
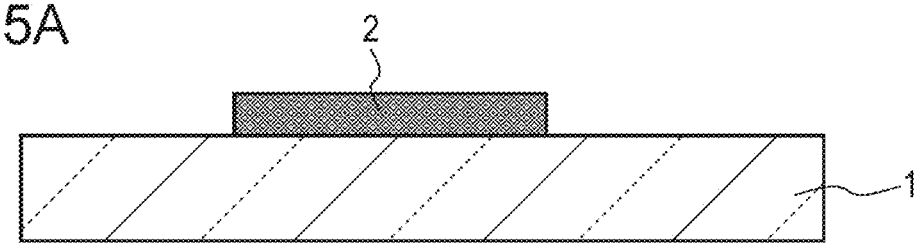
FIG. 5A is a process cross-sectional view showing an active matrix substrate 100 production process.

First, as shown in FIG. 5A, the light-blocking layer 2 is formed on the substrate 1. For example, a glass substrate, a silicon substrate, a heat-resistant plastic substrate (resin substrate), or the like can be used as the substrate 1.

The light-blocking layer 2 is, for example, obtained by forming a light-blocking film (thickness: for example, 50 nm or more and 500 nm or less) by a sputtering method and then patterning the light-blocking film by a photolithographic process. For example, a metal film that contains an element selected from aluminum (Al), chromium (Cr), copper (Cu), tantalum (Ta), titanium (Ti), molybdenum (Mo) and tungsten (W) or an alloy film that contains these elements as components can be used as the light-blocking film. Alternatively, a multilayer film that contains multiple films selected from these may be used. For example, a multilayer film having a titanium film-aluminum film-titanium film three layer structure or a molybdenum film-aluminum film-molybdenum film three layer structure can be used. It should be noted that the light-blocking film is not limited to the one having a three layer structure, and may have a single layer or two layer structure, or a multilayer structure having four or more layers. Here, a multilayer film that includes a Cu alloy film having a thickness of 10 nm or more and 100 nm or less serving as a lower layer and a Cu film having a thickness of 100 nm or more and 500 nm or less serving as an upper layer is used as the light-blocking film.

Figure 5B:
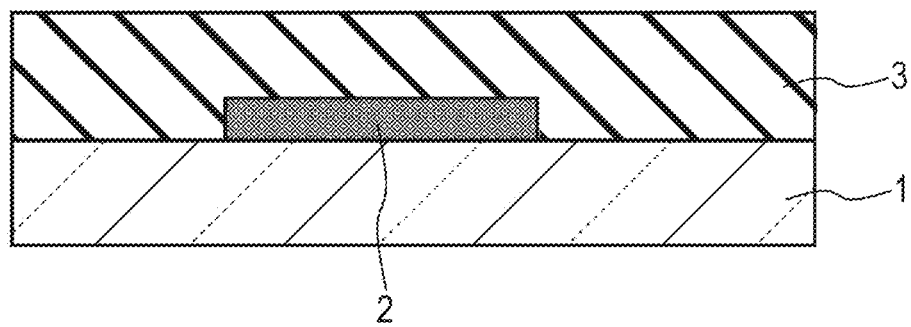
FIG. 5B is a process cross-sectional view showing an active matrix substrate 100 production process.

Next, as shown in FIG. 5B, the lower insulating layer (thickness: for example, 200 nm or more and 600 nm or less) 3 is formed so as to cover the light-blocking layer 2. A silicon oxide ($SiO_2$) layer, a silicon nitride ($SiN_x$) layer, a silicon oxide nitride ($SiO_xN_y$; x>y) layer, a silicon nitride oxide ($SiN_xO_y$; x>y) layer, an aluminum oxide layer, a tantalum oxide layer, or the like can be used as the lower insulating layer 3 as appropriate. The lower insulating layer 3 may have a multilayer structure. Here, as the lower insulating layer 3, a multilayer film having a silicon nitride layer (thickness: 50 to 600 nm) serving as a lower layer and a silicon oxide layer (thickness: 50 to 600 nm) serving as an upper layer is formed by, for example, a CVD method. When an oxide film, such as a silicon oxide film, is used as the lower insulating layer 3 (when the lower insulating layer 3 has a multilayer structure, the uppermost layer thereof), the oxygen deficiencies that occur in the subsequently formed channel region 11*a* of the oxide semiconductor layer 11 can be decreased due to the oxide film; thus, the decrease in resistance of the channel region 11*a* can be suppressed.

Figure 5C:
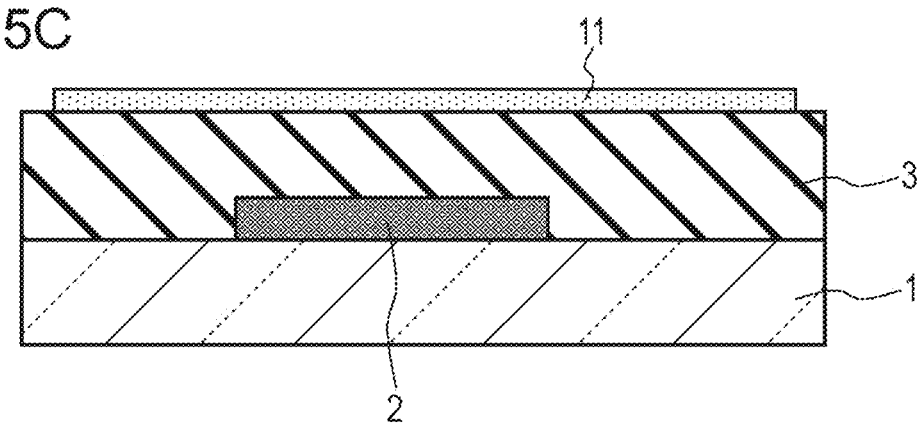
FIG. 5C is a process cross-sectional view showing an active matrix substrate 100 production process.

Next, as shown in FIG. 5C, the oxide semiconductor layer 11 is formed on the lower insulating layer 3. The oxide semiconductor layer 11 is, for example, obtained by forming an oxide semiconductor film (thickness: for example, 15 nm or more and 200 nm or less) by a sputtering method and then patterning the oxide semiconductor film by a photolithographic process. The oxide semiconductor film is not particularly limited but is, for example, an In—Ga—Zn—O-based semiconductor film.

Figure 5D:
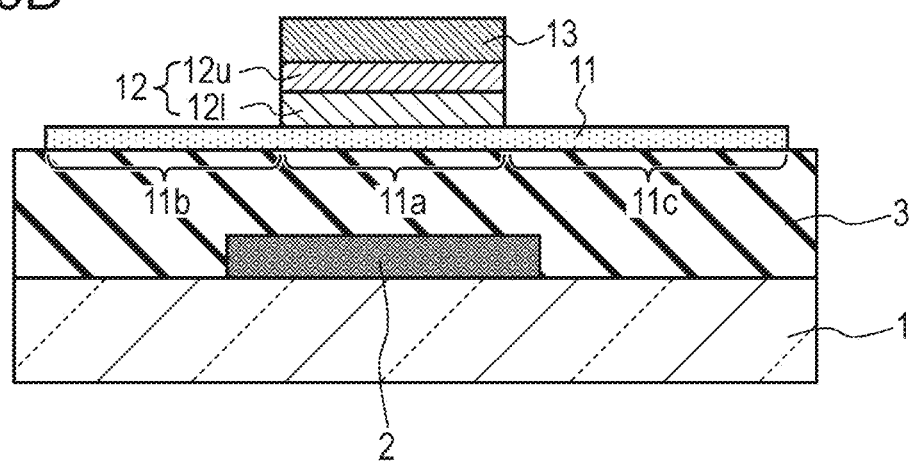
FIG. 5D is a process cross-sectional view showing an active matrix substrate 100 production process.

Subsequently, as shown in FIG. 5D, the gate insulating layer 12 and the gate electrode 13 are formed on the oxide semiconductor layer 11. Specifically, first, a silicon oxide film (thickness: for example, 20 nm or more and 200 nm or less) for the lower layer, a silicon oxide film (thickness: 20 nm or more and 200 nm or less) for the upper layer, and a conductive film (thickness: for example, 50 nm or more and 500 nm or less) for the gate are formed, in that order, so as to cover the oxide semiconductor layer 11. The insulating film can be, for example, formed by using a CVD method, and the conductive film for the gate can be, for example, formed by using a sputtering method.

The silicon oxide film for the lower layer and the silicon oxide film for the upper layer respectively have an H/N ratio of 1.5 or more and 5.0 or less and an H/N ratio of 0.9 or more and 2.0 or less, and are formed so that the H/N ratio of the silicon oxide film for the lower layer is larger than the H/N ratio of the silicon oxide film for the upper layer. When the silicon oxide film for the lower layer and the silicon oxide film for the upper layer are formed by a CVD method, the H/N ratios of the silicon oxide film for the lower layer and the silicon oxide film for the upper layer can be controlled by, for example, adjusting the flow rate ratio of the raw material gases. For example, when $SiH_4$ and $N_2O$ are used as the raw material gases, increasing the flow rate ratio $SiH_4/N_2O$ of $SiH_4$ to $N_2O$ can increase the H/N ratio. Note that the technique for controlling the H/N ratio is not limited to adjusting the raw material gas flow rate ratio. There is no particular limitation on the relationship between the thickness of the silicon oxide film for the lower layer and the silicon oxide film form the upper layer.

Here, a multilayer film that includes a Cu alloy film having a thickness of 10 nm or more and 100 nm or less serving as a lower layer and a Cu film having a thickness of 100 nm or more and 500 nm or less serving as an upper layer is used as the conductive film for the gate.

Next, the gate electrode 13 is formed by patterning the conductive film for the gate by using a resist mask not shown in the drawing. The conductive film for the gate can be patterned by wet etching or dry etching.

Subsequently, the silicon oxide film for the lower layer and the silicon oxide film for the upper layer are patterned by using the aforementioned resist mask so as to form a gate insulating layer 12 that includes an upper layer 12u and a lower layer 12l. The silicon oxide film for the lower layer and the silicon oxide film for the upper layer can be patterned by, for example, dry etching. Note that, after removing the resist mask, the silicon oxide film for the lower layer and the silicon oxide film for the upper layer can be patterned by using the gate electrode 13 as a mask.

In this step, since the silicon oxide film for the lower layer, the silicon oxide film for the upper layer, and the conductive film for the gate are patterned by using the same mask, the side surface of the gate insulating layer 12 and the side surface of the gate electrode 13 align in the thickness direction. In other words, when viewed in a direction of a line normal to the substrate surface, the edge of the gate insulating layer 12 aligns with the edge of the gate electrode 13.

Next, the oxide semiconductor layer 11 is subjected to a resistance-decreasing process. For example, a plasma process can be performed as the resistance-decreasing process. In this manner, when viewed in a direction of a line normal to the substrate surface, regions of the oxide semiconductor layer 11 that do not overlap the gate electrode 13 and the gate insulating layer 12 constitute a first low-resistance region 11b and a second low-resistance region 11c that have lower specific resistances than the region overlapping the gate electrode 13 and the gate insulating layer 12.

In the plasma process, a portion of the oxide semiconductor layer 11 that is not covered with the gate electrode 13 is exposed to a reducing plasma or a dopant-containing plasma (for example, argon plasma). In this manner, the specific resistance decreases near the surface of the exposed portion of the oxide semiconductor layer 11, and thus the first low-resistance region 11b and the second low-resistance region 11c are formed. In the oxide semiconductor layer 11, a portion masked by the gate electrode 13 forms the channel region 11a that remains unaffected by the resistance-decreasing process. The method and conditions for the resistance-decreasing process are described in, for example, Japanese Unexamined Patent Application Publication No. 2008-40343. For reference, the entire contents of the disclosures in Japanese Unexamined Patent Application Publication No. 2008-40343 are incorporated in this description.

Figure 6A:
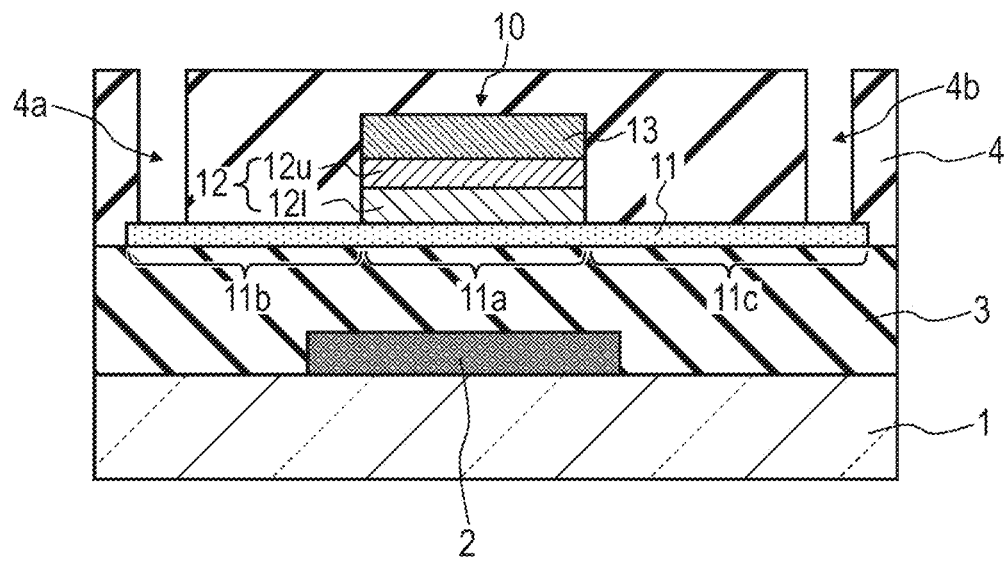
FIG. 6A is a process cross-sectional view showing an active matrix substrate 100 production process.

Subsequently, as shown in FIG. 6A, the upper insulating layer 4 that covers the gate electrode 13 and the oxide semiconductor layer 11 is formed. The upper insulating layer 4 can be formed by using a single layer of an inorganic insulating film such as a silicon oxide film, a silicon nitride film, a silicon oxide nitride film, or a silicon nitride oxide film, or by stacking these films. The thickness of the inorganic insulating layer is, for example, 100 nm or more and 500 nm or less. Forming the upper insulating layer 4 by using an insulating film, such as a silicon nitride film, that reduces an oxide semiconductor is desirable since the specific resistance of the region (here, the first low-resistance region 11b and the second low-resistance region 11c) of the oxide semiconductor layer 11 in contact with the upper insulating layer 4 can be maintained at a low level. Here, as the upper insulating layer 4, a multilayer film having a silicon nitride layer (thickness: 50 to 600 nm) serving as a lower layer and a silicon oxide layer serving as an upper layer is formed by, for example, a CVD method. Note that since a sufficiently low specific resistance can be realized by a resistance-decreasing process such as a plasma process, the upper insulating layer 4 (in a multilayer structure, the lower layer of the upper insulating layer 4) does not have to be an insulating film that reduces the oxide semiconductor. Subsequently, the source-side opening portion 4a and the drain-side opening portion 4b that reach the oxide semiconductor layer 11 are formed in the upper insulating layer 4 by, for example, dry etching. Here, in the regions other than the source-side opening portion 4a and the drain-side opening portion 4b, an opening portion that is continuous throughout the upper insulating layer 4 and the lower insulating layer 3 may be formed as necessary.

Figure 6B:
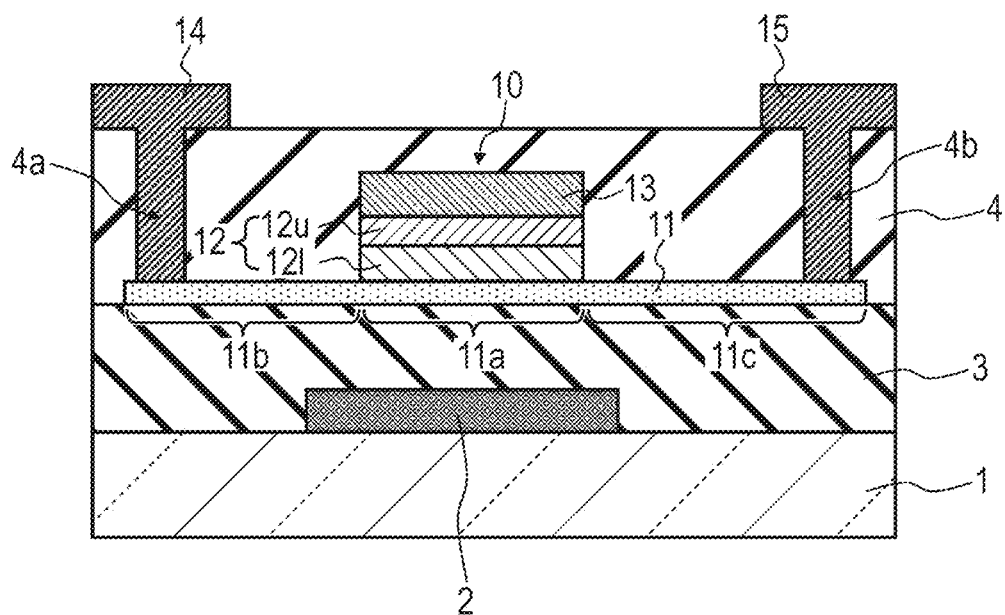
FIG. 6B is a process cross-sectional view showing an active matrix substrate 100 production process.

Next, as shown in FIG. 6B, the source electrode 14 and the drain electrode 15 are formed on the upper insulating layer 4. Here, a conductive film (thickness: for example, 50 nm or more and 500 nm or less) for the source is formed on the upper insulating layer 4 and in the source-side opening portion 4a and the drain-side opening portion 4b, and the conductive film for the source is patterned to obtain the source electrode 14 and the drain electrode 15. Patterning can be performed by wet etching or dry etching. As a result, the pixel TFT 10 can be obtained.

For example, an element selected from aluminum (Al), chromium (Cr), copper (Cu), tantalum (Ta), titanium (Ti), molybdenum (Mo) and tungsten (W) or an alloy that contains these elements as components can be used as the conductive film for the source. For example, a three layer structure such as a titanium film-aluminum film-titanium film three layer structure or a molybdenum film-aluminum film-molybdenum film three layer structure can be used. It should be noted that the conductive film for the source is not limited to the one having a three layer structure, and may have a single layer or two layer structure, or a multilayer structure having four or more layers. Here, a multilayer film that includes a Ti film (thickness: 15 nm or more and 70 nm or less) serving as a lower layer and a Cu film (thickness: 200 nm or more and 400 nm or less) serving as an upper layer is used as the conductive film for the source.

Figure 7A:
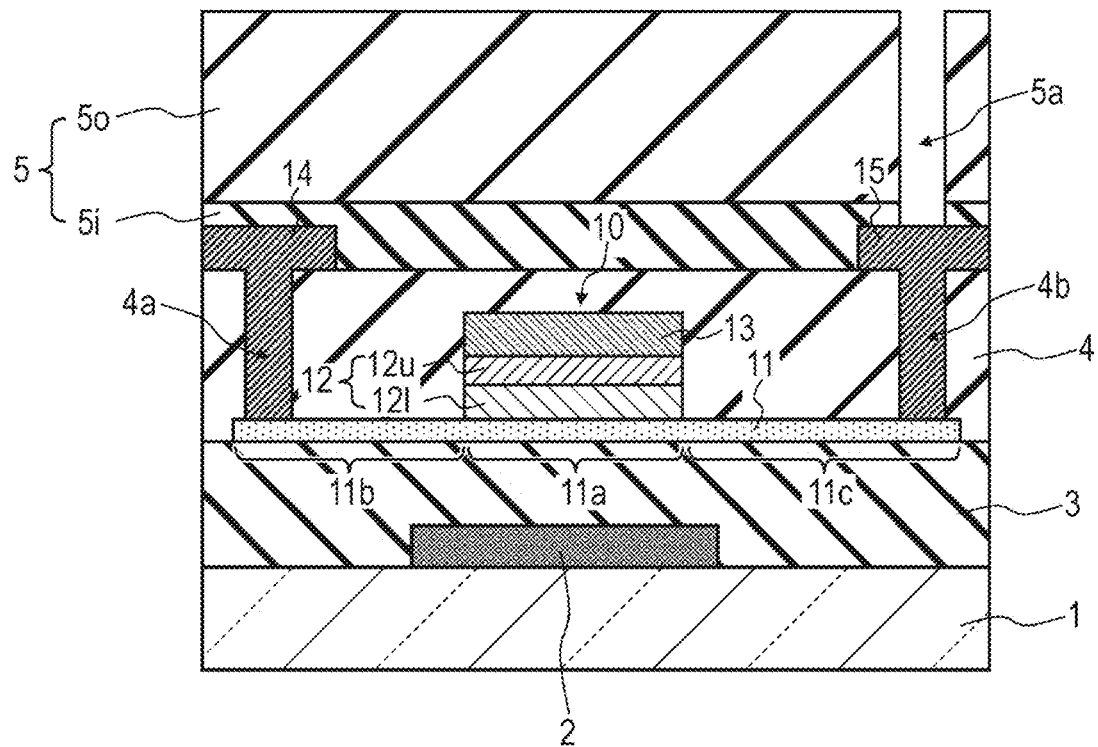
FIG. 7A is a process cross-sectional view showing an active matrix substrate 100 production process.

Subsequently, as shown in FIG. 7A, the interlayer insulating layer 5 is formed so as to cover the pixel TFT 10. Here, as the interlayer insulating layer 5, an inorganic insulating layer (thickness: for example, 100 nm or more and 400 nm or less) 5i and an organic insulating layer (thickness: for example, 1 µm or more and 3 µm or less and preferably 2 µm or more and 3 µm or less) 5o are formed in that order. The material for the inorganic insulating layer 5i may be the same as the material described as the example of the material for the upper insulating layer 4. Here, a silicon nitride layer (thickness: for example, 200 nm) is formed as the inorganic insulating layer 5i by a CVD method. The organic insulating layer 5o is formed of, for example, a photosensitive resin material. An organic insulating layer 5o containing an opening portion can be obtained by forming a resin film by using a photosensitive resin material and performing exposure and development. An opening portion can be formed in the inorganic insulating layer 5i by performing, for example, dry etching using this organic insulating layer 5o as a mask, and thus a pixel contact hole 5a constituted by the opening portion in the organic insulating layer 5o and the opening portion in the inorganic insulating layer 5i can be obtained.

Figure 7B:
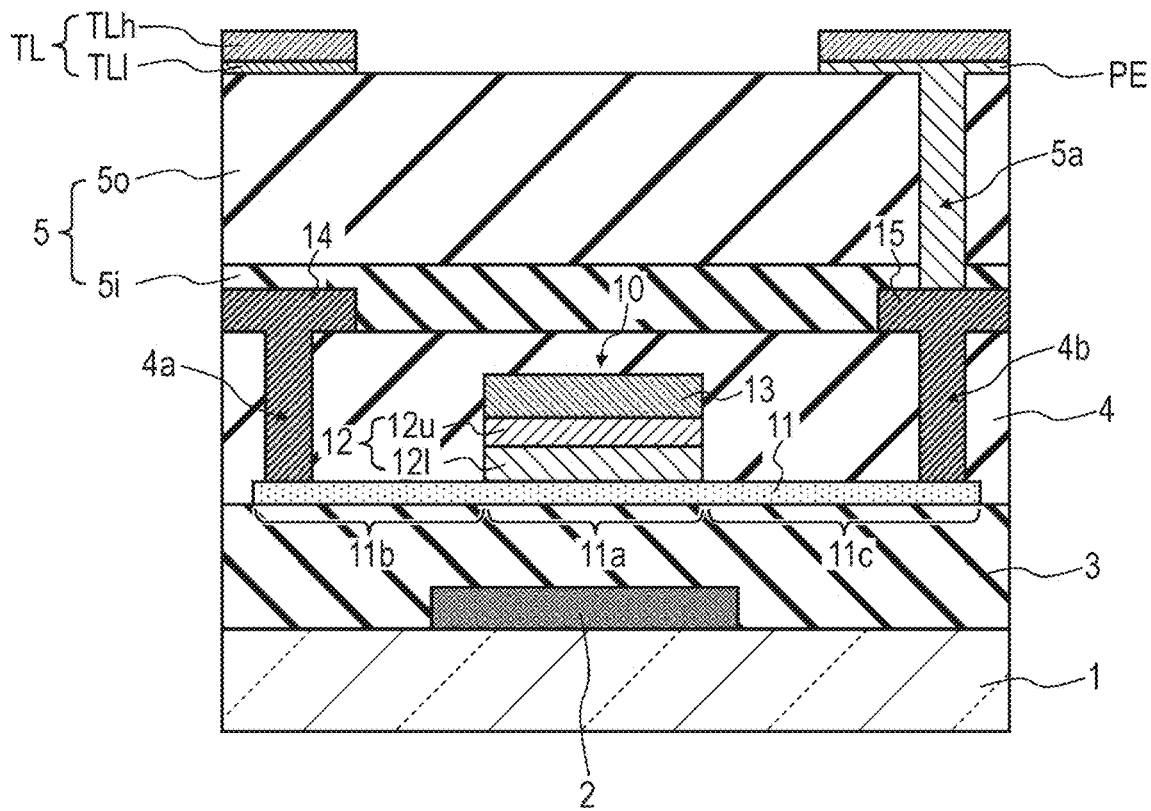
FIG. 7B is a process cross-sectional view showing an active matrix substrate 100 production process.

Next, as shown in FIG. 7B, the pixel electrode PE and the touch wire TL are formed. First, a first transparent conductive film (thickness: for example, 20 nm or more and 300 nm or less) is formed on the interlayer insulating layer 5 and in the pixel contact hole 5a. Here, for example, an indium-tin oxide (ITO) film is formed as the first transparent conductive film by a sputtering method. An indium-zinc oxide (IZO)

film, a ZnO film, or the like may be used as the first transparent conductive film. Next, a metal film for the touch wire is formed on the first transparent conductive film. Here, a Cu film (thickness: 100 nm or more and 500 nm or less) is formed as the metal film for the touch wire by, for example, a sputtering method. Subsequently, the metal film for the touch wire and the first transparent conductive film are patterned to obtain a pixel electrode PE and a touch wire TL. The metal film for the touch wire and the first transparent conductive film can be patterned by, for example, wet etching.

Figure 8A:
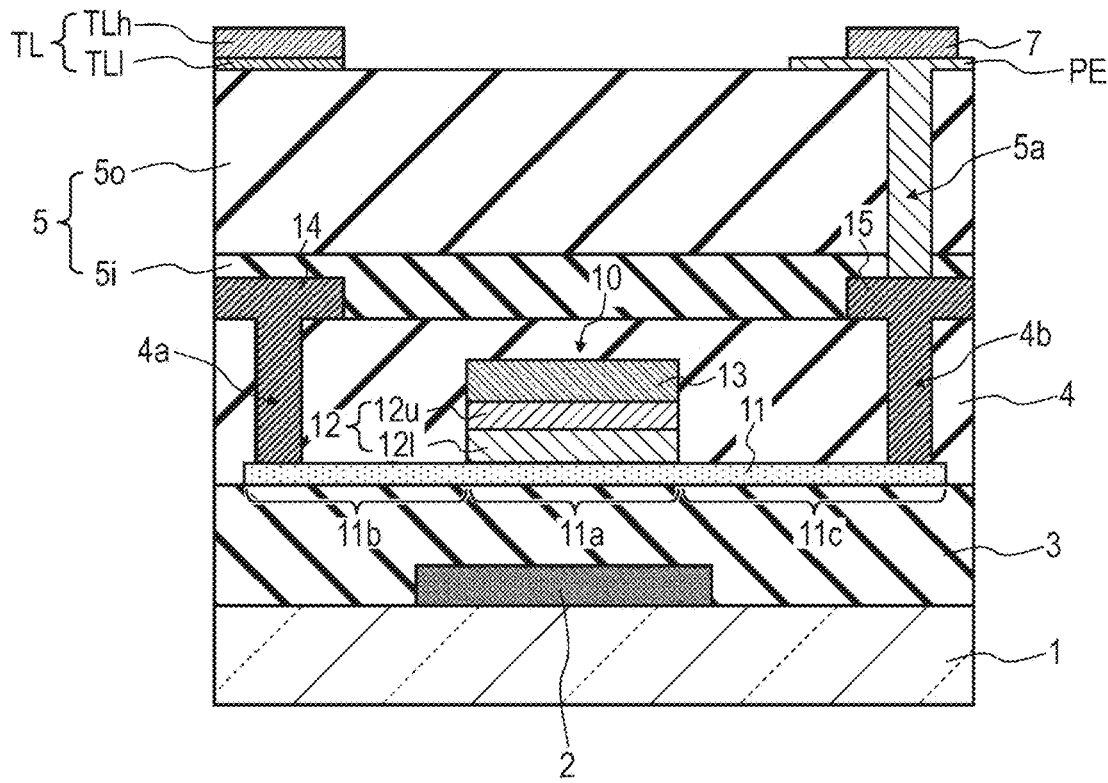
FIG. 8A is a process cross-sectional view showing an active matrix substrate 100 production process.

Next, as shown in FIG. 8A, in the first transparent conductive film remaining on the pixel electrode PE, a portion other than the portion that will form the protective electrode layer 7 is removed by a photolithographic process.

Figure 8B:
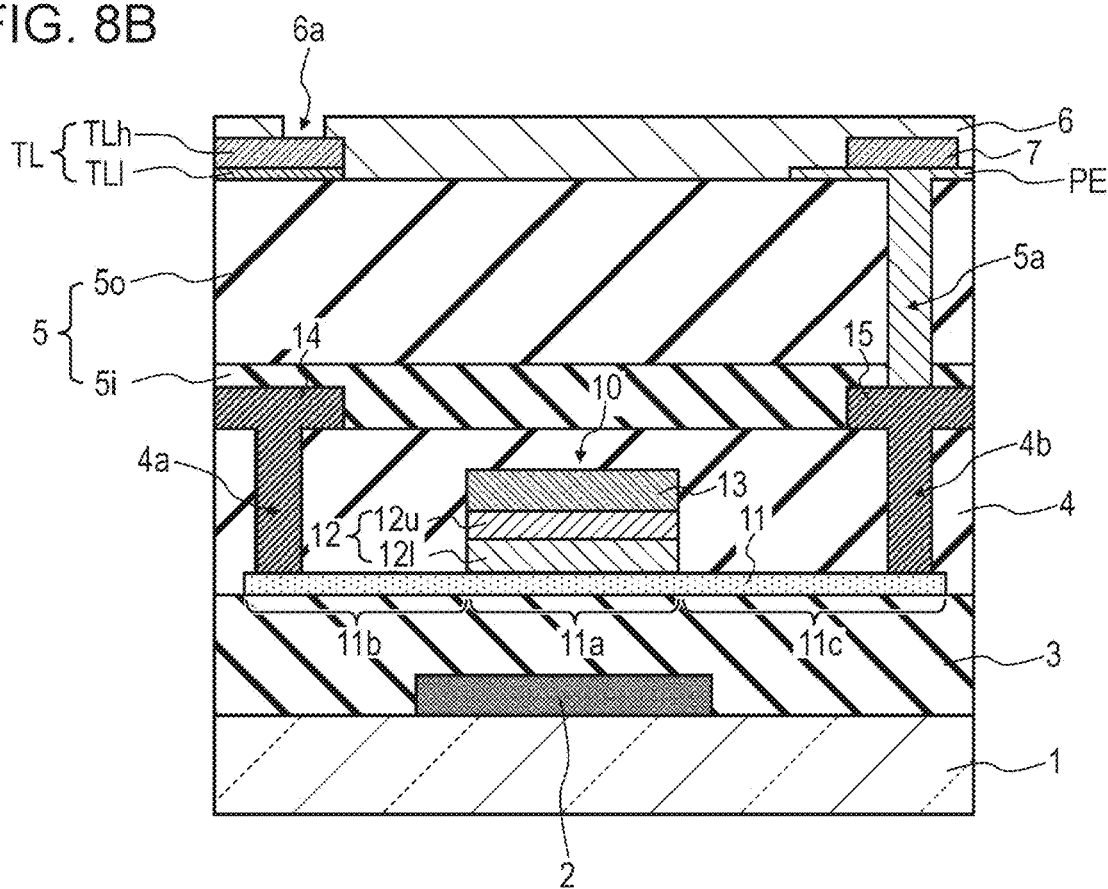
FIG. 8B is a process cross-sectional view showing an active matrix substrate 100 production process.

Next, as shown in FIG. 8B, the dielectric layer (thickness: for example, 50 nm or more and 500 nm or less) 6 is formed on the interlayer insulating layer 5 and the pixel electrode PE. The material for the dielectric layer 6 may be the same as the material described as the example of the material for the inorganic insulating layer 5*i*. Here, a silicon nitride film is formed as the dielectric layer 6 by, for example, a CVD method. Subsequently, the contact hole 6*a* is formed in the dielectric layer 6 by, for example, dry etching.

Next, the common electrode CE is formed on the dielectric layer 6, and then an alignment film is formed to cover the common electrode CE so that the active matrix substrate 100 shown in FIG. 2 is obtained. The common electrode CE is obtained by forming a second transparent conductive film (thickness: for example, 20 nm or more and 300 nm or less) on the dielectric layer 6 and then patterning the second transparent conductive film. The material for the second transparent conductive film may be the same as the material described as the example of the material for the first transparent conductive film. As such, the active matrix substrate 100 is produced.

Modification Example

In the description above, the FFS mode is described as an example of the display mode. The FFS mode is a horizontal electric field-type display mode in which a pair of electrodes are disposed on one substrate to apply a horizontal electric field to the liquid crystal layer. The horizontal electric field type has an advantage in that, since liquid crystal molecules do not rise up from the substrate, a wider viewing angle is realized compared to the vertical electric field type.

The structure in which the common electrode CE is disposed on the pixel electrode PE with the dielectric layer 6 therebetween is disclosed in, for example, Japanese Unexamined Patent Application Publication No. 2008-032899 and Japanese Unexamined Patent Application Publication No. 2010-008758. Conversely, the pixel electrode PE may be disposed on the common electrode CE with the dielectric layer 6 therebetween. Such a structure is disclosed in, for example, International Publication No. 2012/086513. For reference, the entire contents of the disclosures in Japanese Unexamined Patent Application Publication No. 2008-032899, Japanese Unexamined Patent Application Publication No. 2010-008758, and International Publication No. 2012/086513 are incorporated in this description.

The IPS mode is also known as a horizontal electric field type display mode other than the FFS mode. The liquid crystal display device according to an embodiment of the present disclosure may perform display in the IPS mode. Furthermore, the active matrix substrate of the liquid crystal display device according to an embodiment of the present disclosure may not be equipped with the common electrode CE. Such an active matrix substrate can be used in liquid crystal display devices of twisted nematic (TN) mode, vertical alignment (VA) mode, etc. The VA mode and the TN mode are vertical electric field-type display modes in which a pair of electrodes arranged to oppose each other with a liquid crystal layer therebetween apply a vertical electric field to the liquid crystal layer.

The liquid crystal display device according to an embodiment of the present disclosure may not be equipped with the touch sensor.

Figure 9:
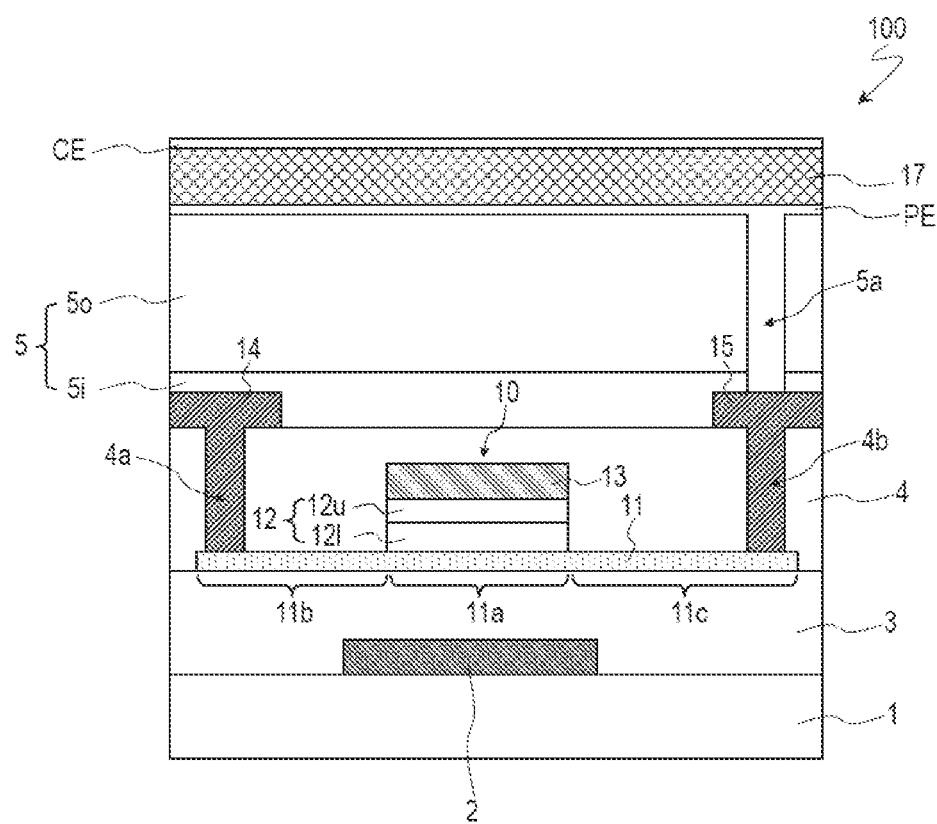
FIG. 9 is a cross-sectional view schematically showing a modified pixel structure of the active matrix substrate 100.

The display device according to an embodiment of the present disclosure is not limited to a liquid crystal display device and may be a different display device, for example, an organic EL display device. An organic EL display device is equipped with an organic EL layer 17 disposed on a pixel electrode PE, shown in FIG. 9.

Regarding Oxide Semiconductor

An oxide semiconductor contained in the oxide semiconductor layer 11 may be an amorphous oxide semiconductor or a crystalline oxide semiconductor that has a crystalline portion. Examples of the crystalline oxide semiconductor include polycrystalline oxide semiconductors, microcrystalline oxide semiconductors, and crystalline oxide semiconductors having the c axis oriented substantially perpendicular to the layer surface.

The oxide semiconductor layer 11 may have a multilayer structure constituted by two or more layers. The oxide semiconductor layer 11 having a multilayer structure may include an amorphous oxide semiconductor layer and a crystalline oxide semiconductor layer, or may include multiple crystalline oxide semiconductor layers having different crystal structures. Alternatively, the oxide semiconductor layer 11 having a multilayer structure may include multiple amorphous oxide semiconductor layers. When the oxide semiconductor layer 11 has a two layer structure that includes an upper layer and a lower layer, the energy gap of the oxide semiconductor contained in the lower layer may be larger than the energy gap of the oxide semiconductor contained in the upper layer. However, when the difference in energy gap between these layers is relatively small, the energy gap of the oxide semiconductor of the upper layer may be larger than the energy gap of the oxide semiconductor of the lower layer.

The material, the structure, and the film forming method of the amorphous oxide semiconductor and the aforementioned crystalline oxide semiconductors and the structure of the oxide semiconductor layer having a multilayer structure, etc., are described in, for example, Japanese Unexamined Patent Application Publication No. 2014-007399. For reference, the entire contents of the disclosures in Japanese Unexamined Patent Application Publication No. 2014-007399 are incorporated in this description.

The oxide semiconductor layer 11 may contain at least one metal element selected from In, Ga, and Zn, for example. In this embodiment, the oxide semiconductor layer 11 contains, for example, an In—Ga—Zn—O-based semiconductor (for example, indium gallium zinc oxide). Here, the In—Ga—Zn—O-based semiconductor is a tertiary oxide containing indium (In), gallium (Ga), and zinc (Zn), the ratio between In, Ga, and Zn (compositional ratio) is not particularly limited, and examples thereof include In:Ga:Zn=2:2:1, In:Ga:Zn=1:1:1, and In:Ga:Zn=1:1:2. Such an oxide semiconductor layer 11 can be formed from an oxide semiconductor film containing an In—Ga—Zn—O-based semiconductor.

The In—Ga—Zn—O-based semiconductor may be amorphous or crystalline. As the crystalline In—Ga—Zn—O-based semiconductor, a crystalline In—Ga—Zn—O-based semiconductor in which the c axis is oriented substantially perpendicular to the layer surface is desirable.

Note that the crystal structure of the crystalline In—Ga—Zn—O-based semiconductor is disclosed in the aforementioned Japanese Unexamined Patent Application Publication No. 2014-007399, Japanese Unexamined Patent Application Publication No. 2012-134475, Japanese Unexamined Patent Application Publication No. 2014-209727, etc. For reference, the entire contents of the disclosures in Japanese Unexamined Patent Application Publication No. 2012-134475 and Japanese Unexamined Patent Application Publication No. 2014-209727 are incorporated in this description. A TFT that has an In—Ga—Zn—O-based semiconductor layer has high mobility (twenty times or more greater than that of a-Si TFT) and a low leak current (less than one hundredth of that of a-Si TFT), and thus is suitable for use as a drive TFT (for example, a TFT included in a drive circuit that is disposed around the display region including multiple pixels and on the same substrate as the display region) and a pixel TFT (a TFT disposed in the pixel).

The oxide semiconductor layer 11 may contain a different oxide semiconductor instead of the In—Ga—Zn—O-based semiconductor. For example, an In—Sn—Zn—O-based semiconductor (for example, $In_2O_3$—$SnO_2$—ZnO, InSnZnO) may be contained. The In—Sn—Zn—O-based semiconductor is an indium (In)-tin (Sn)-zinc (Zn) tertiary oxide. Alternatively, the oxide semiconductor layer 11 may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), a Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, or the like.

According to an embodiment of the present disclosure, the reliability of an active matrix substrate and a display device equipped with a top gate structure oxide semiconductor TFT can be improved. The embodiments of the present disclosure are suitable for use in various display devices such as liquid crystal display devices and organic EL display devices.

The present disclosure contains subject matter related to that disclosed in U.S. Provisional Patent Application No. 62/983,792 filed in the U.S. Patent Office on Mar. 2, 2020, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate that has a plurality of pixel regions arranged in a matrix, the active matrix substrate comprising:
   a substrate;
   pixel TFTs supported by the substrate and disposed to respectively correspond to the plurality of pixel regions; and
   pixel electrodes respectively disposed in the plurality of pixel regions and electrically connected to the pixel TFTs,
   wherein each of the pixel TFTs is a top gate structure TFT that has an oxide semiconductor layer, a gate insulating layer disposed on the oxide semiconductor layer, and a gate electrode disposed to oppose the oxide semiconductor layer with the gate insulating layer therebetween,
   the gate insulating layer is formed of silicon oxide,
   the gate insulating layer includes a lower layer in contact with the oxide semiconductor layer and an upper layer placed on the lower layer, and
   when a ratio of the number of hydrogen atoms to the number of nitrogen atoms contained in the lower layer is referred to as a lower layer H/N ratio and a ratio of the number of hydrogen atoms to the number of nitrogen atoms contained in the upper layer is referred to as an upper layer H/N ratio,
   the lower layer H/N ratio is 1.5 or more and 5.0 or less,
   the upper layer H/N ratio is 0.9 or more and 2.0 or less, and
   the lower layer H/N ratio is larger than the upper layer H/N ratio.

2. The active matrix substrate according to claim 1, wherein the lower layer H/N ratio is 1.5 or more and 2.5 or less.

3. The active matrix substrate according to claim 1, wherein the upper layer H/N ratio is 0.9 or more and 1.3 or less.

4. The active matrix substrate according to claim 1, wherein the oxide semiconductor layer contains an In—Ga—Zn—O-based semiconductor.

5. The active matrix substrate according to claim 4, wherein the In—Ga—Zn—O-based semiconductor contains a crystalline portion.

6. A display device comprising the active matrix substrate according to claim 1.

7. The display device according to claim 6, wherein the display device is a liquid crystal display device comprising:
   a counter substrate disposed to oppose the active matrix substrate;
   a liquid crystal layer disposed between the active matrix substrate and the counter substrate.

8. The display device according claim 6, wherein the display device is an organic EL display device comprising an organic EL layer disposed on the pixel electrodes.

* * * * *